US011175350B2

(12) United States Patent
Ferre Fabregas et al.

(10) Patent No.: US 11,175,350 B2
(45) Date of Patent: Nov. 16, 2021

(54) LEAKAGE CURRENT MONITORING SYSTEM

(71) Applicant: LEAR CORPORATION, Southfield, MI (US)

(72) Inventors: Antoni Ferre Fabregas, Valls (ES); Carlos Fernandez Pueyo, Valls (ES)

(73) Assignee: Lear Corporation, Southfield, MI (US)

( * ) Notice: Subject to any disclaimer, the term of this patent is extended or adjusted under 35 U.S.C. 154(b) by 1 day.

(21) Appl. No.: 16/853,227

(22) Filed: Apr. 20, 2020

(65) Prior Publication Data

US 2021/0325479 A1    Oct. 21, 2021

(51) Int. Cl.
```
G01R 31/52      (2020.01)
B60L 3/00       (2019.01)
G01R 31/00      (2006.01)
G01R 31/327     (2006.01)
```

(52) U.S. Cl.
CPC ............ *G01R 31/52* (2020.01); *B60L 3/0069* (2013.01); *G01R 31/007* (2013.01); *G01R 31/327* (2013.01)

(58) Field of Classification Search
CPC ...... G01R 31/50; G01R 31/52; G01R 31/007; G01R 31/327
See application file for complete search history.

(56) References Cited

U.S. PATENT DOCUMENTS

| 6,011,403 | A | 1/2000 | Gillette | |
|---|---|---|---|---|
| 7,023,178 | B2 | 4/2006 | Iwabuchi et al. | |
| 7,126,342 | B2 | 10/2006 | Iwabuchi et al. | |
| 7,446,549 | B2 | 11/2008 | Tomita et al. | |
| 9,857,448 | B1* | 1/2018 | Li | G01R 31/52 |
| 2005/0062490 | A1* | 3/2005 | Polonsky | G01R 31/2621 324/754.23 |
| 2006/0061215 | A1* | 3/2006 | Ferre | H02J 9/061 307/24 |
| 2006/0119179 | A1* | 6/2006 | Escoda | H02J 7/1423 307/10.1 |
| 2007/0109006 | A1* | 5/2007 | Klass | G01R 31/52 324/750.3 |
| 2007/0241758 | A1* | 10/2007 | Kamata | G01R 31/52 324/537 |

(Continued)

FOREIGN PATENT DOCUMENTS

JP    2005003394 A    1/2005

*Primary Examiner* — Patrick Assouad
*Assistant Examiner* — Demetrius R Pretlow
(74) *Attorney, Agent, or Firm* — Brooks Kushman P.C.

(57) ABSTRACT

A battery connection unit includes a first branch with a first branch switch adapted to connect a first battery to at least one of a second battery and a vehicle load; and a second branch with a second branch switch connected in parallel with the first branch. A first measurement switch is connected between the first branch and a storage element to enable/disable charging. A second measurement switch is connected between the second branch and the storage element. A processor is programmed to: disable at least one of the first branch and the second branch; enable at least one of the first measurement switch and the second measurement switch to charge the storage element with leakage current; and generate an output signal indicative of a switch fault in response to a storage element voltage associated with the leakage current exceeding a reference voltage within a predetermined time period.

20 Claims, 4 Drawing Sheets

(56) References Cited

U.S. PATENT DOCUMENTS

| | | | | |
|---|---|---|---|---|
| 2008/0011528 A1* | 1/2008 | Verbrugge | ............. | B60L 50/61 |
| | | | | 180/65.29 |
| 2008/0129308 A1* | 6/2008 | Lindsey | ................ | G01R 31/52 |
| | | | | 324/525 |
| 2010/0156426 A1* | 6/2010 | Kang | ..................... | B60L 58/18 |
| | | | | 324/444 |
| 2010/0237872 A1* | 9/2010 | Kang | ................... | H01M 10/48 |
| | | | | 324/429 |
| 2012/0091792 A1* | 4/2012 | Wu | .......................... | B60L 1/00 |
| | | | | 307/10.1 |
| 2014/0043058 A1* | 2/2014 | Onishi | ................... | G01R 31/52 |
| | | | | 324/762.01 |
| 2014/0109556 A1* | 4/2014 | Hashimoto | .............. | B60L 3/04 |
| | | | | 60/299 |
| 2014/0376137 A1* | 12/2014 | Wang | .................... | G01R 31/52 |
| | | | | 361/86 |
| 2015/0233996 A1* | 8/2015 | Yoon | ..................... | G01R 31/52 |
| | | | | 324/509 |
| 2015/0256116 A1* | 9/2015 | Tateda | ..................... | B60L 3/04 |
| | | | | 318/504 |
| 2016/0238658 A1* | 8/2016 | Edwards | ............ | G01R 31/3278 |
| 2017/0160761 A1* | 6/2017 | Chan | ........................ | G05F 1/66 |
| 2018/0079310 A1* | 3/2018 | Kawashima | .......... | B60W 20/00 |
| 2019/0101585 A1* | 4/2019 | Marques Martins | ....................... | |
| | | | | H01L 29/7848 |
| 2019/0331725 A1* | 10/2019 | Ikushima | ............... | G01R 15/18 |
| 2020/0200815 A1* | 6/2020 | Neidorff | ............ | G01R 31/3008 |
| 2020/0333393 A1* | 10/2020 | Fayneh | ............. | G01R 31/2884 |
| 2021/0011090 A1* | 1/2021 | Sato | ....................... | G01R 31/52 |

\* cited by examiner

LEAKAGE CURRENT MONITORING SYSTEM

TECHNICAL FIELD

One or more embodiments relate to a vehicle power distribution system for monitoring leakage current.

BACKGROUND

Vehicles include power distribution systems with switches to connect and disconnect a power source, e.g., a battery, from vehicle electrical systems. The performance of such switches decreases over time, resulting in current conducting, or leaking, through the switch when it is open. Leakage current in a power distribution system may be difficult to measure on-board a vehicle with conventional current measuring equipment, because leakage current is much lower than operating current.

SUMMARY

In one embodiment, a battery connection unit includes a first branch and a second branch. The first branch is adapted to connect a first battery to at least one of a second battery and a vehicle load, and includes at least one first branch switch to enable/disable current flow along the first branch. The second branch is connected in parallel with the first branch, and includes at least one second branch switch to enable/disable current flow along the second branch. The system also includes a storage element; a first measurement switch connected between the first branch and the storage element to enable/disable charging of the storage element; a second measurement switch connected between the second branch and the storage element to enable/disable charging of the storage element; and a processor. The processor is programmed to: disable at least one of the first branch and the second branch; enable at least one of the first measurement switch and the second measurement switch to charge the storage element with leakage current from the at least one disabled branch; and generate an output signal indicative of a switch fault in response to a storage element voltage associated with the leakage current exceeding a reference voltage within a predetermined time period.

In another embodiment, a battery connection unit includes a at least one branch adapted to connect a first battery to at least one of a second battery and a vehicle load. The branch includes a first switch and a second switch connected in series along the branch to enable/disable bidirectional current flow. A first measurement switch is connected between the first switch and the second switch of the branch and a storage element to enable/disable charging of the storage element with first branch leakage current.

In yet another embodiment, a method of monitoring leakage current of a power distribution system is provided. A battery connection unit is provided with: a first branch switch to enable/disable bidirectional current flow between a first battery and at least one of a second battery and a vehicle load, and a second branch switch to enable/disable bidirectional current flow between the first battery and the at least one second battery and vehicle load. A monitoring circuit is provided with: a storage element, a first measurement switch connected between the first branch switch and the storage element to enable/disable charging of the storage element, and a second measurement switch connected between the second branch switch and the storage element to enable/disable charging of the storage element. At least one of the first branch switch and the second branch switch is disabled. At least one of the first measurement switch and the second measurement switch is enabled to charge the storage element with leakage current from the at least one disabled branch switch. An output signal indicative of a switch fault is generated in response to a storage element voltage associated with the leakage current exceeding a reference voltage within a predetermined time period.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
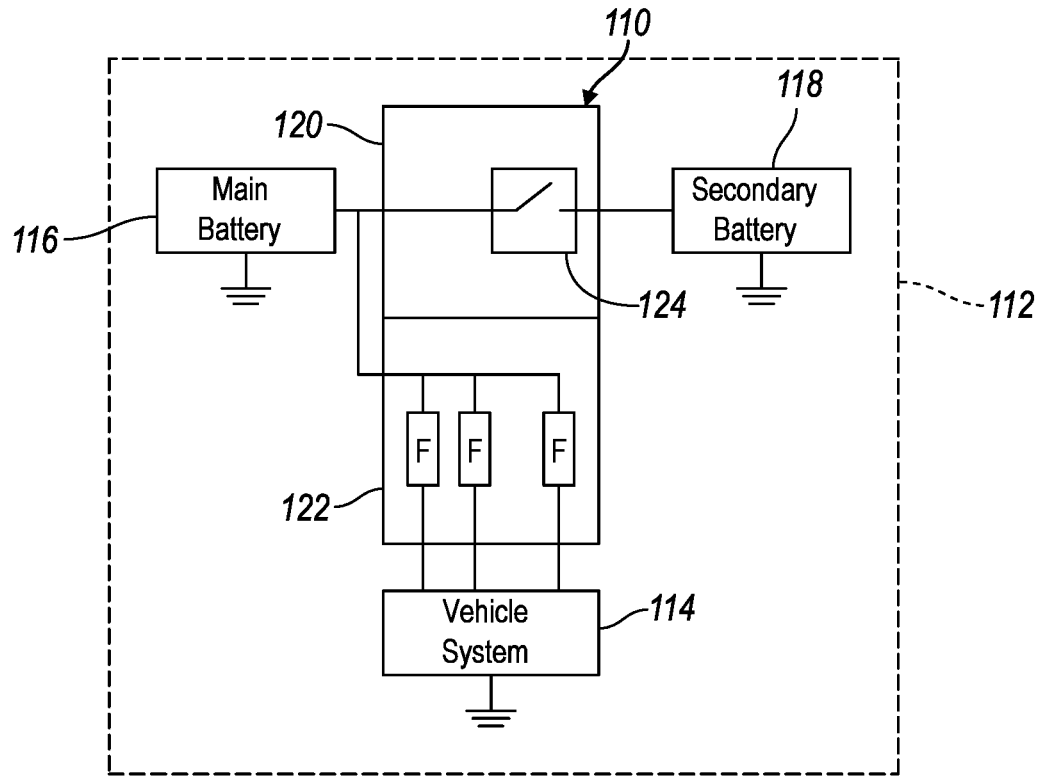
FIG. 1 is a schematic block diagram of a vehicle having two power sources and a power distribution system including a battery connection unit, according to one or more embodiments.

With reference to FIG. 1, a vehicle power distribution system is illustrated in accordance with one or more embodiments and generally referenced by numeral 110. The power distribution system 110 is depicted within a vehicle 112, and electrically connects one or more power sources to a vehicle electrical system 114. The power distribution system 110 includes two power sources: a main battery 116, and a secondary battery 118, according to the illustrated embodiment. The power distribution system 110 also includes a battery connection unit 120 and a fuse box 122, according to one or more embodiments. The battery connection unit 120 includes a switch unit 124, including one or more switches that connect/disconnect the batteries 116, 118 from the vehicle electrical system 114. The battery connection unit 120 also includes a controller 126 (shown in FIG. 2) for controlling the switch unit 124. In other embodiments, the power distribution system 110 is implemented in a vehicle having a single battery 116 (shown in FIGS. 5-7B).

During vehicle operation, the controller 126 controls the switch unit 124 to supply electrical power from the batteries 116, 118 to various loads of the vehicle electrical system 114, e.g., powertrain, heating and cooling systems. When the vehicle 112 is idle, or not operated, the controller 126 controls the switch unit 124 to open and disconnect the batteries 116, 118 from the vehicle electrical system 114. The performance of the switch unit 124 may decrease over time, which ultimately may lead to a switch that can not function properly, e.g., open or close. Prior to such loss of functionality, the open-switch impedance, i.e., the impedance of the switch when it is open, may decrease and allow current to conduct, or leak, through the switch when the switch is open. The battery connection unit 120 monitors this leakage current and notifies other vehicle systems if the leakage current exceeds a predetermined leakage current threshold, so that the switch unit 124 can be serviced prior to loss, or degradation of functionality.

The power distribution system 110 may supply high current to the vehicle electrical system 114 during operating conditions, e.g., over one hundred amps. However, the instantaneous leakage current may be relatively low as compared to operating current. For example, the leakage current may be in the micro-ampere range. Current sensors that measure current in the micro-ampere range may be expensive and not practical for an on-board vehicle sensor. The battery connection unit 120 includes a monitoring circuit 128 with a storage element that charges over time to monitor the leakage current without using such an expensive sensor. The controller 126 and the monitoring circuit 128 may be collectively referred to as a leakage current monitoring system.

Figure 2:
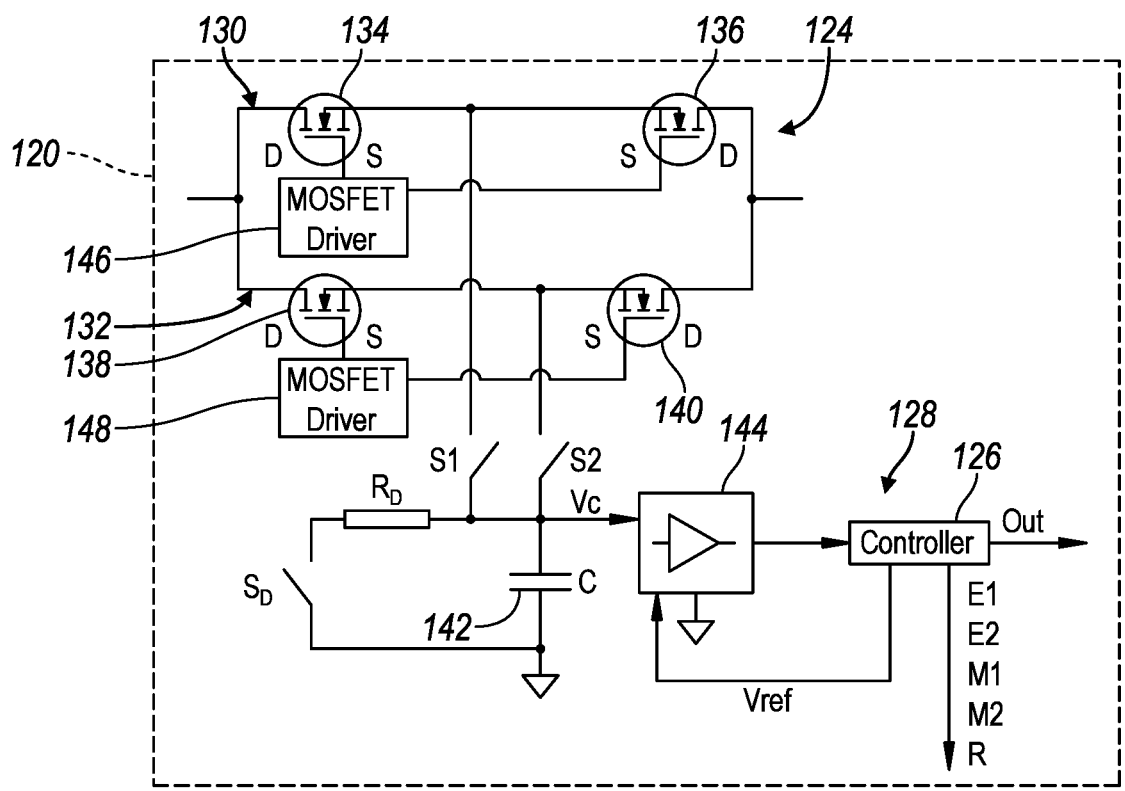
FIG. 2 is a schematic diagram of the battery connection unit of FIG. 1, including a switch unit and a monitoring circuit.

With reference to FIG. 2, the battery connection unit 120 includes the switch unit 124, the controller 126, and the monitoring circuit 128. The switch unit 124 includes a pair of switches that are connected in a back to back configuration, according to one or more embodiment. The switch unit 124 includes two complementary branches, a first branch 130 and a second branch 132, that perform similar functions, i.e., connecting the batteries 116, 118 to the vehicle electrical system 114, according to the illustrated embodiment. The branches 130, 132 share the power transfer, so that for an embodiment having two branches, each branch 130, 132 may handle approximately half of the total current, which may allow for less expensive switches. Although illustrated as a pair of parallel branches, other embodiments of the battery connection unit 120 include a single branch or more than two branches.

Each branch 130, 132 includes two switches arranged in series, according to one or more embodiments. The first branch 130 includes a first switch 134 and a second switch 136, and the second branch 132 includes a third switch 138 and a fourth switch 140. Each switch 134, 136, 138, 140 is an n-channel metal-oxide-semiconductor field-effect transistor (nMOSFET) according to the illustrated embodiment. A MOSFET is a three-terminal device with a source (S), a drain (D), and a gate (G). Each branch 130, 132 includes two switches arranged in a common—source back-to-back configuration, according to the illustrated embodiment. This configuration allows for bi-directional current flow and closure through each branch. For example, the batteries 116, 118 supply current to the vehicle electrical system 114; and the vehicle electrical system 114 may include devices that generate current, e.g., a generator (not shown), for charging the batteries 116, 118.

The monitoring circuit 128 monitors the leakage current over time. The monitoring circuit 128 includes a storage element, such as a capacitor 142, that is connected to the switching unit 124 and charges based on receipt of the leakage current. The voltage across the capacitor (Vc) is measured by the controller 126. In the illustrated embodiment, the monitoring circuit 128 includes a comparator 144 that compares Vc to a reference voltage (Vref) that is provided by the controller 126, where Vref corresponds to a predetermined leakage current threshold. After a predetermined period of time, if Vc exceeds Vref, the comparator 144 provides an output signal (OUT) to the controller 126, and the controller 126 notifies other vehicle electrical systems 114.

The monitoring circuit 128 includes a first measurement switch ($S_1$) and a second measurement switch ($S_2$) for connecting to the first branch 130 and the second branch 132 of the switch unit, respectively. The monitoring circuit 128 also includes a discharge switch ($S_D$) that in combination with resistor $R_D$ is connected in parallel with the capacitor 142 for discharging current stored in the capacitor 142.

The controller 126 provides control signals to enable/disable each switch. The switch unit 124 includes a first driver 146 that is connected to the gate of the first switch 134 and to the gate of the second switch 136 of the first branch 130, according to one or more embodiments. The controller 126 provides a control signal (E1) to the first driver 146 to collectively enable/disable the first switch 134 and the second switch 136. The switch unit 124 also includes a second driver 148 that is connected to the gate of the third switch 138 and to the gate of the fourth switch 140 of the second branch 132, according to one or more embodiments. The controller 126 provides a control signal (E2) to the second driver 148 to collectively enable/disable the third switch 138 and the fourth switch 140. In other embodiments, the battery connection unit 120 includes a driver for driving each switch (not shown), and the controller 126 provides a control signal to each driver, e.g., E1a, E1b, E2a, and E2b. Although shown as separate components, the controller 126 may include the driver functionality, and the controller 126 may provide control signals directly to the switches.

The controller 126 provides a control signal (M1) to the first measurement switch (S1), and a control signal (M2) to the second measurement switch (S2), to enable/disable portions of the monitoring circuit 128 through each switch. The controller 126 may control S1 and S2 independently of each other to create different monitoring configurations, including: both switches enabled; both switches disabled; a monitoring circuit A configuration, where S1 is enabled and S2 is disabled; and a monitoring circuit B configuration, where S2 is enabled and S1 is disabled. The controller 126 also provides a control signal (R) to the discharge switch ($S_D$) to reset the monitoring circuit.

Figure 3:
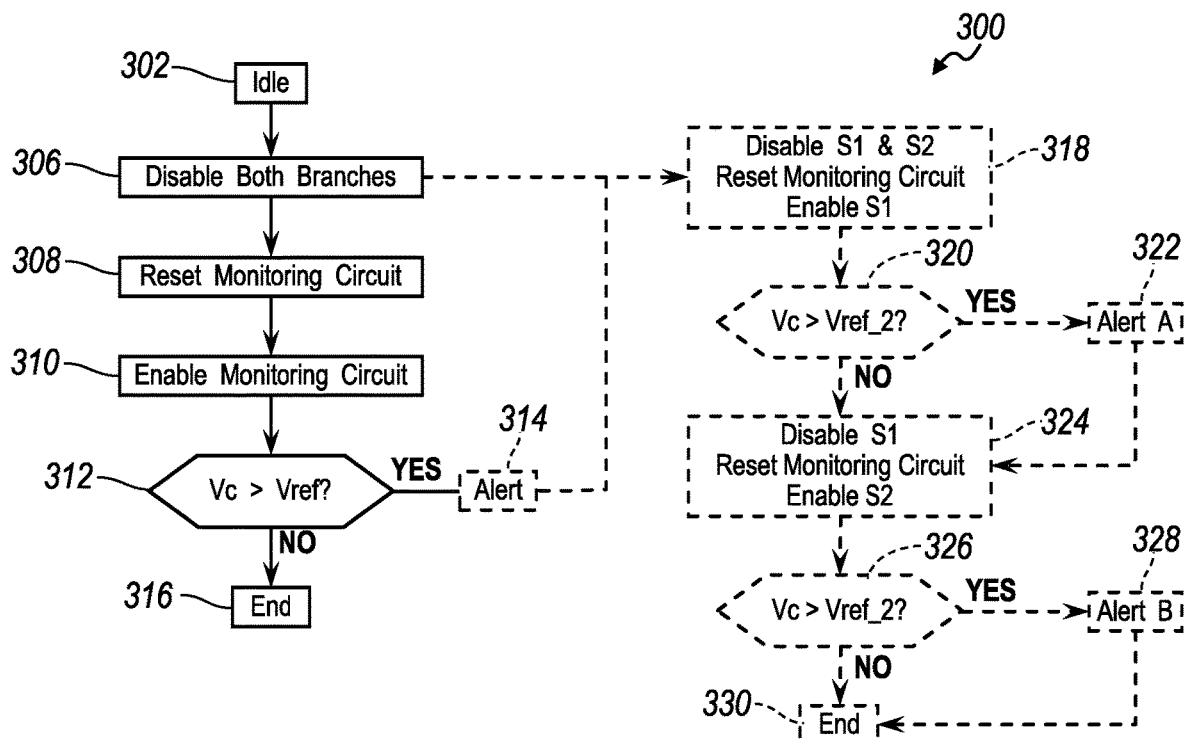
FIG. 3 is a flow chart illustrating a method for monitoring the leakage current of the switch unit of FIG. 2, according to one or more embodiments.

With reference to FIG. 3, a method for monitoring leakage current of the vehicle power distribution system 110 is illustrated according to one or more embodiments and generally referenced by numeral 300. The method is implemented using software code contained with the controller 126 according to one or more embodiments. The controller 126 generally includes any number of processors, microprocessors, ASICs, ICs, memory (e.g., FLASH, ROM, RAM, EPROM and/or EEPROM) and software code to co-act with one another to perform a series of operations. The controller 126 also includes predetermined data, or "look up tables" that are stored within the memory, according to one or more embodiments. While the method is described using a flowchart that is illustrated with a number of sequential steps, one or more steps may be omitted and/or executed in another manner in one or more other embodiments.

At step 302, the controller 126 determines that the vehicle 112 is at idle. When the vehicle 112 is at idle, the vehicle electrical system 114 does not draw high current from the batteries 116, 118. The controller 126 communicates with other vehicle controllers and/or systems (not shown), e.g., over a CAN bus, and determines that the vehicle is at idle at step 302 based on signals received from these other systems, according to one or more embodiments. For example, the controller 126 may determine that the vehicle is at idle based on signals that are indicative of vehicle speed, engine speed, key status, and/or gear selection. At step 306 the controller 126 disables both branches of the switch unit 124, i.e., the first branch 130 and the second branch 132.

Figure 4:
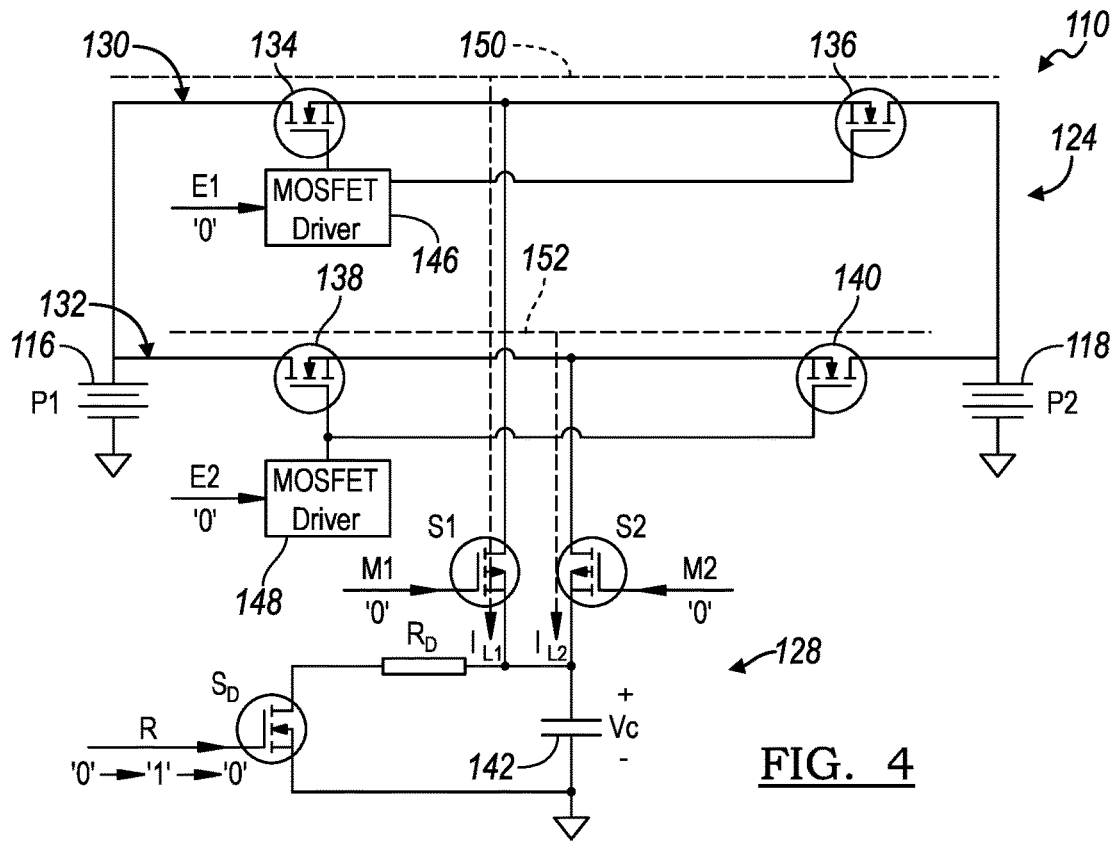
FIG. 4 is a circuit diagram of the power distribution system of FIG. 1, illustrating the method for monitoring leakage current of FIG. 3.

FIG. 4 is a circuit diagram of the power distribution system 110 implemented in a vehicle 112 having two batteries, e.g., the main battery 116 and the secondary battery 118. The switches 134, 136, 138, 140 are active high nMOSFETs, according to the illustrated embodiment. The controller disables the first branch 130 of the switch unit 124 by providing a low voltage ("0") control signal (E1) to the first driver 146, which in turn opens the first switch 134 and the second switch 136. The controller disables the second branch 132 of the switch unit 124 by providing a low voltage ("0") control signal (E2) to the second driver 148, which in turn opens the third switch 138 and the fourth switch 140.

Referring to FIGS. 3 and 4, at step 308, the controller 126 resets the monitoring circuit 128. The storage element 142 of the monitoring circuit 128 may accumulate energy over time. When enabled, the discharge switch $S_D$ discharges any energy stored in the storage element 142 by providing a parallel path to ground having a lower impedance. The discharge switch $S_D$ is an active high nMOSFET, according to the illustrated embodiment. The controller resets the monitoring circuit 128 by providing a high voltage ("1") control signal (R) to the discharge switch ($S_D$) to enable (close) the switch. Then, after a predetermined time, the controller provides a low voltage ("0") control signal (R) to the discharge switch ($S_D$) to disable (open) the switch.

At step 310, the controller 126 enables the monitoring circuit 128. The first measurement switch (S1) and the second measurement switch (S2) are active low p-channel MOSFETs (pMOSFETs), according to the illustrated embodiment. The controller enables monitoring of the first branch 130 of the switch unit 124 by providing a low voltage ("0") control signal (M1) to the first measurement switch (S1), which in turn closes the switch. With the first measurement switch S1 closed, first branch leakage current ($I_{L1}$) from the open first switch 134 and second switch 136 flows to the monitoring circuit 128 for a predetermined time, as depicted by dashed line 150.

The controller 126 also enables monitoring of the second branch 132 of the switch unit 124 according to one or more embodiments, by providing a low voltage ("0") control signal (M2) to the second measurement switch (S2), which in turn closes the switch. With the second measurement switch S2 closed, second branch leakage current ($I_{L2}$) from the open third switch 138 and fourth switch 140 will flow to the monitoring circuit 128, as depicted by dashed line 152.

At step 312, the controller 126 compares the voltage drop (Vc) across the storage element 142 to a reference voltage (Vref). Vc will increase over time due to the accumulation of the leakage current from the first branch ($I_{L1}$) and the second branch ($I_{L2}$), according to Equation 1:

$$Vc = 1/CI_L \Delta t \quad (1)$$

Where C represents the capacitance of the capacitor storage element 142, and $I_L$ represents the sum of the first branch leakage current ($I_{L1}$) and the second branch leakage current ($I_{L2}$). $\Delta t$ represents a predetermined period of time for charging the capacitor. If the controller 126 determines that Vc is greater than Vref at step 312, the controller 126 proceeds to step 314 and generates an output signal that is indicative of an alert or fault associated with the switch unit 124. However, if Vc is not greater than Vref, the controller 126 proceeds to step 316 to complete the analysis.

For example, in one embodiment, the reference voltage (Vref) associated with monitoring all four switches 134, 136, 138, 140 at the same time, is equal to 40 Volts, the capacitance (C) is equal to 100 micro-farads (µF), and the predetermined time period (Δt) is equal to 100 seconds. The 40V is computed as a reference limit as follows, if the maximum current leakage for each switch (i.e., the datasheet leakage current for the MOSFET) is 10 uA, and 40 uA for four switches, then while the leakage current is less than the datasheet limit (i.e. not degraded), the maximum leaked charge (Q) is equal to 4.0 milli-coulomb (Q=40 uA*100 s=4 mQ), and the resulting capacitor voltage (Vc) is equal to 40V, (Vc=Q/C=4.0 mQ/100 uF=40V). Therefore, if a capacitor voltage (Vc) higher than (Vref) is observed before the predetermined time period (Δt), this will indicate that the MOSFET leakage current is over the datasheet limit and degradation has already started, and the controller generates an output signal that is indicative of an alert or fault associated with the switch unit 124.

In another embodiment, the reference voltage (Vref) associated with monitoring all four switches 134, 136, 138, 140 at the same time is equal to 10 Volts, the capacitance (C) is equal to 100 micro-farads (µF), and the predetermined time period (Δt) is equal to 25 seconds. The 10V is computed as a reference limit as follows, if the maximum current leakage for each switch (i.e., the datasheet leakage current for the MOSFET) is 10 uA, and 40 uA for four switches, then while the leakage current is less than the datasheet limit (i.e. not degraded), the maximum leaked charge (Q) is equal to 1.0 milli-coulomb (Q=40 uA*25 s=1 mQ), and the resulting capacitor voltage (Vc) is equal to 10V, (Vc=Q/C=1.0 mQ/100 uF=10V).

Although the above steps describe analyzing both branches of the switch unit 124 at the same time, in other embodiments of the battery connection unit 120, the controller 126 analyzes each branch of the switch unit 124 separately. With such an approach, the controller 126 may provide different alerts, e.g., one associated with the switches of the first branch 130, and one associated with the switches of the second branch 132. In other embodiments, the controller 126 may save Vc in its memory for future reference. For example, the controller 126 may compare Vc to one or more previously measured Vc values to observe a tendency, or a rate of change of Vc. With such an approach, the controller 126 may be able to compare a rate of change of Vc to a predetermined rate of change value and generate a fault before Vc reaches the Vref threshold.

In one embodiment, the controller 126 analyzes each branch of the switch unit 124 separately. After disabling both branches of the switch unit 124 at step 306, the controller 126 proceeds to step 318 and disables the first measurement switch (S1) and the second measurement switch (S2) if either switch is currently enabled, and then resets the monitoring circuit 128. Again, the controller resets the monitoring circuit 128 by providing a high voltage ("1") control signal (R) to the discharge switch ($S_D$) to enable (close) the switch, then, after a predetermined time, the controller provides a low voltage ("0") control signal (R) to the discharge switch ($S_D$) to disable (open) $S_D$. Next, the controller 126 enables monitoring circuit A by providing a low voltage ("0") control signal (M1) to the first measurement switch (S1) to close the switch. With the first measurement switch S1 closed, and the second measurement switch S2 open, first branch leakage current ($I_{L1}$) flows to monitoring circuit A, but second branch leakage current ($I_{L2}$) does not.

At step 320, the controller 126 compares the voltage drop (Vc) across the storage element 142 to a second reference voltage (Vref_2) for the predetermined time (Δt). In one embodiment, Vref_2 is equal to half of Vref described above with reference to step 312. For example, as described above, Vref associated with monitoring all four switches 134, 136, 138, 140 at the same time may be equal to 40 Volts. The second reference voltage (Vref_2) associated with monitoring one branch (two switches) at the same time may be equal to 20 Volts, the capacitance (C) is equal to 100 micro-farads (µf), and the predetermined time period (Δt) is equal to 100 seconds. The 20V is computed as a reference limit as follows, if the maximum current leakage for each switch (i.e., the datasheet leakage current for the MOSFET) is 10 uA, and 20 uA for two switches, then while the leakage current is less than the datasheet limit (i.e. not degraded), the maximum leaked charge (Q) is equal to 2.0 milli-coulomb (Q=20 uA*100 s=2 mQ), and the resulting capacitor voltage (Vc) is equal to 20V, (Vc=Q/C=2.0 mQ/100 uF=20V). Vc will increase over time due to the accumulation of the leakage current from the first branch ($I_{L1}$) according to Equation 1 (shown above). Where C represents the capacitance of the capacitor storage element 142, and $I_L$ represents the first branch leakage current ($I_{L1}$). Δt represents the predetermined period of time for charging the capacitor.

In another embodiment, the controller 126 compares the voltage drop (Vc) across the storage element 142 to the reference voltage (Vref) for a second predetermined time (Δt_2), where Δt_2 is equal to double Δt described above with reference to step 312. For example, in one embodiment, the predetermined time period (Δt) is equal to 100 seconds and the second predetermined time period (Δt_2) is equal to 200 seconds, and the reference voltage (Vref) associated with monitoring one branch (two switches) is equal to 40 Volts. The 40V is computed as a reference limit as follows, if the maximum current leakage for each switch (i.e., the datasheet leakage current for the MOSFET) is 10 uA, and 20 uA for two switches, then while the leakage current is less than the datasheet limit (i.e. not degraded), the maximum leaked charge (Q) is equal to 4.0 milli-coulomb (Q=20 uA*200 s=4 mQ), and the resulting capacitor voltage (Vc) is equal to 40V, (Vc=Q/C=4.0 mQ/100 uF=40V).

If the controller 126 determines that Vc is greater than Vref_2 at the predetermined time (or that Vc is greater than Vref for a second predetermined time) at step 320, the controller 126 proceeds to step 322 and generates an output signal that is indicative of an alert or fault that is associated with the first branch 130 of the switch unit 124.

If the controller 126 determines that Vc is not greater than Vref_2 at step 320, the controller 126 proceeds to step 324, and disables monitoring circuit A, resets the monitoring circuit, and then enables monitoring circuit B. The controller 126 disables monitoring circuit A by providing a high voltage ("1") control signal (M1) to the first measurement switch (S1) to open the switch. Then the controller 126 resets the monitoring circuit 128 by providing a high voltage ("1") control signal (R) to the discharge switch ($S_D$) to enable (close) the switch, and then provides a low voltage ("0") control signal (R) to the discharge switch ($S_D$) to disable (open) the switch after a predetermined time. The controller 126 enables monitoring circuit B by providing a low voltage ("0") control signal (M2) to the second measurement switch (S2) to close the switch. With the second measurement switch S2 closed, and the first measurement switch S1 open, second branch leakage current ($I_{L2}$) flows to monitoring circuit B, but first branch leakage current ($I_{L1}$) does not, for a predetermined time.

At step 326, the controller 126 again compares the voltage drop (Vc) across the storage element 142 to the second reference voltage (Vref_2) for the second predetermined time (Δt_2). Vc will increase over time due to the accumulation of the leakage current from the second branch ($I_{L2}$) according to Equation 1 (shown above). Where C represents the capacitance of the capacitor storage element 142, and $I_L$ represents the second branch leakage current ($I_{L2}$). Δt_2 represents a second predetermined period of time for charging the capacitor. If the controller 126 determines that Vc is greater than Vref_2 at step 326, the controller 126 proceeds to step 328 and generates an output signal that is indicative of an alert or fault associated with the second branch 132 of the switch unit 124. However, if Vc is not greater than Vref_2, the controller 126 proceeds to step 330 to complete the method.

In another embodiment, the controller 126 performs steps 318-330 after step 312 or step 314. In one embodiment, after identifying a fault with the switch unit 124, the controller 126 performs steps 318-330 to further diagnose the fault, i.e., whether the fault is associated with the first branch 130 and/or the second branch 132.

Figure 5:
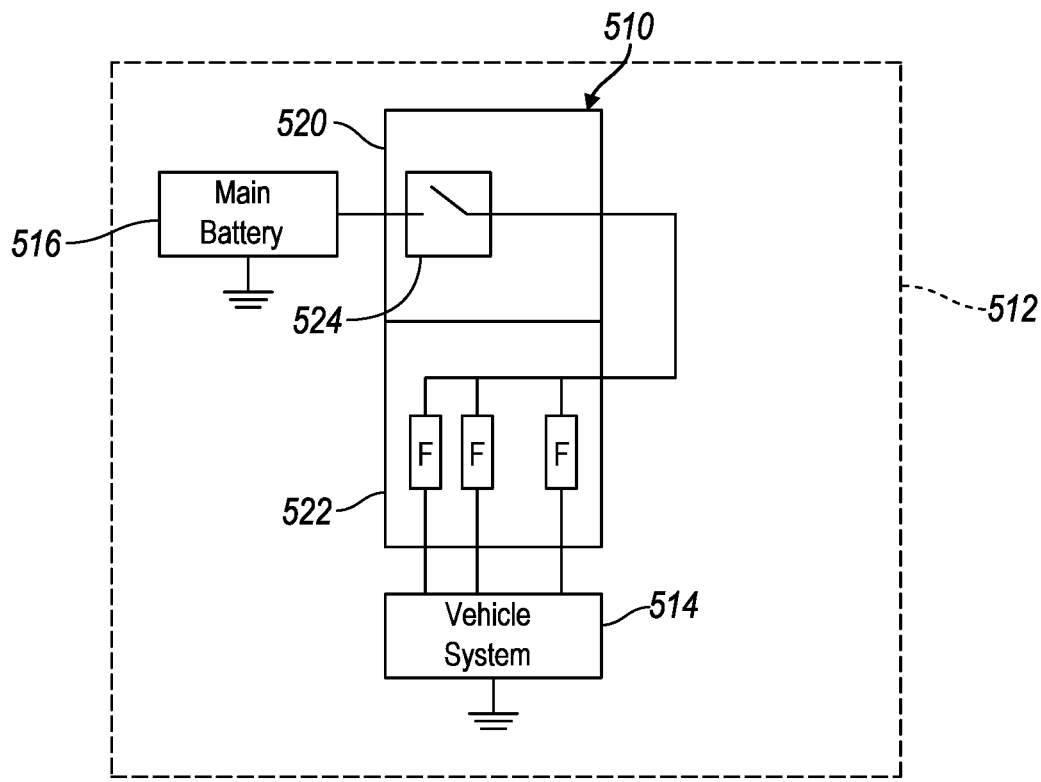
FIG. 5 is a schematic block diagram of another vehicle having one power source and a power distribution system including a battery connection unit according to one or more embodiments.

With reference to FIG. 5, a vehicle power distribution system is illustrated in accordance with one or more embodiments and generally referenced by numeral 510. The power distribution system 510 is depicted within a vehicle 512, and electrically connects one power source, e.g., main battery 516, to a vehicle electrical system 514.

The power distribution system 510 includes the main battery 516, a battery connection unit 520, and a fuse box 522, according to one or more embodiments. Similar to power distribution system 110, the power distribution system 510 may include elements 524, 526, 528, 530, 532, 534, 536, 538, 540, 542, 544, 546, 548, 550, 552 consistent with operation of elements 124, 126, 128, 130, 132, 134, 136, 138, 140, 142, 144, 146, 148, 150, 152, respectively, discussed above. The battery connection unit 520 includes a switch unit 524, including one or more switches that connect/disconnect the battery 516 from the vehicle electrical system 514. The battery connection unit 520 also includes a controller 526 (shown in FIGS. 7A-7B) for controlling the switch unit 524.

Figure 6:
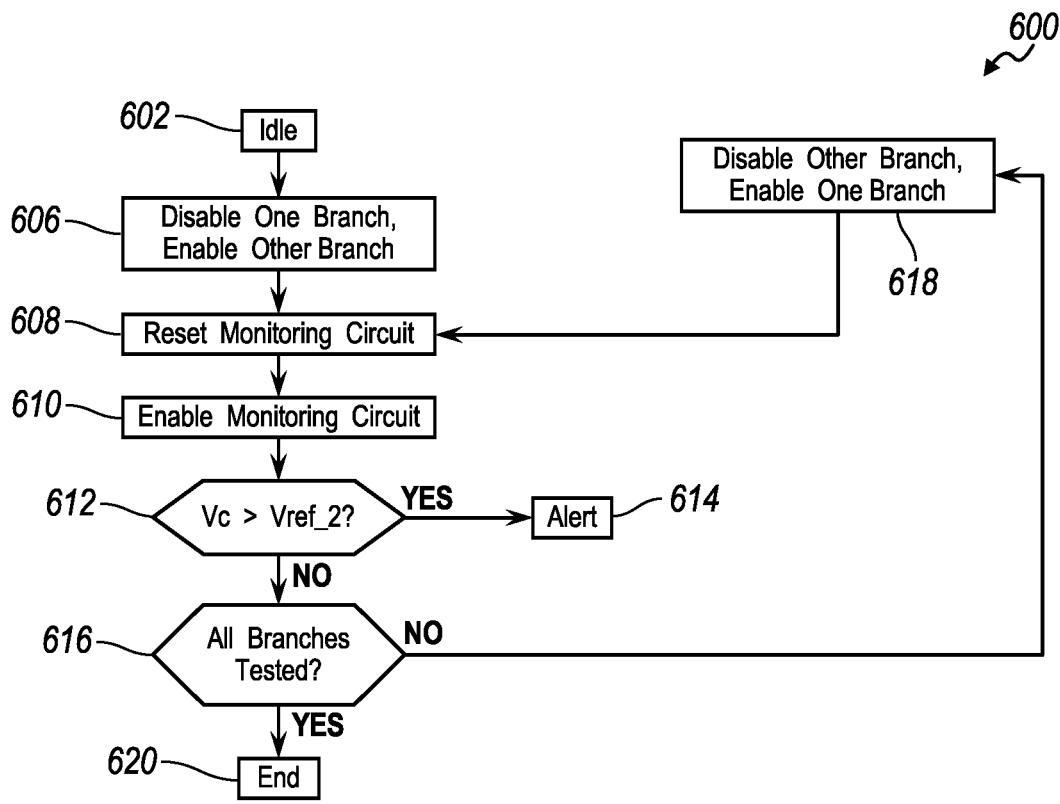
FIG. 6 is a flow chart illustrating a method for monitoring the leakage current of the switch unit of FIG. 2, implemented in the power distribution system of FIG. 5, according to one or more embodiments.

With reference to FIG. 6, a method for monitoring leakage current of the vehicle power distribution system 510 is illustrated according to one or more embodiments and generally referenced by numeral 600. The method is implemented using software code contained with the controller 526 according to one or more embodiments. The controller 526 generally includes any number of processors, microprocessors, ASICs, ICs, memory (e.g., FLASH, ROM, RAM, EPROM and/or EEPROM) and software code to co-act with one another to perform a series of operations. The controller 526 also includes predetermined data, or "look up tables" that are stored within the memory, according to one or more embodiments. While the method is described using a flowchart that is illustrated with a number of sequential steps, one or more steps may be omitted and/or executed in another manner in one or more other embodiments.

At step 602, the controller 526 determines that the vehicle 512 is at idle. When the vehicle 512 is at idle, the vehicle electrical system 514 does not draw high current from the main battery 516. At step 606, the controller 526 disables one branch and enables the other branch of the switch unit 524. The power distribution system 510 may be used in a vehicle having a single main battery 516, in such an application, the power distribution system 510 may disable one branch of the switch unit 524 at a time, to ensure there is still energy available to control the various switches.

Figure 7A:
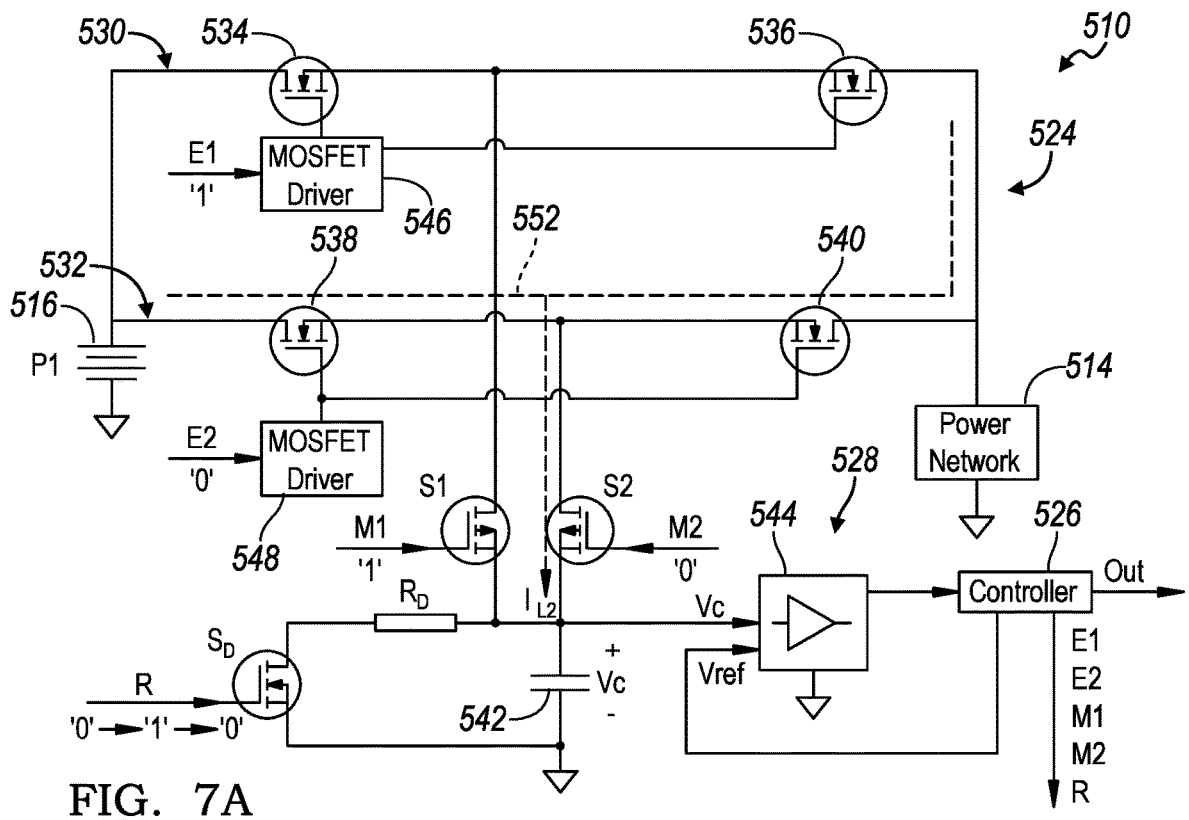
FIG. 7A is a circuit diagram of the power distribution system of FIG. 5 in a first configuration, illustrating the method for monitoring leakage current of FIG. 6.

FIG. 7A is a circuit diagram of the power distribution system 510 implemented in a vehicle 512 having one battery, the main battery 516, and illustrated with the first branch 530 enabled, and the second branch 532 disabled. Again, the switches 534, 536, 538, 540 are active high nMOSFETs, according to the illustrated embodiment. The controller 526 enables the first branch 530 of the switch unit 524 by providing a high voltage ("1") control signal (E1) to the first driver 546, which in turn closes the first switch 534 and the second switch 536. The controller 526 disables the second branch 532 of the switch unit 524 by providing a low voltage ("0") control signal (E2) to the second driver 548, which in turn opens the third switch 538 and the fourth switch 540. The enabled first branch 530 provides a supply path for the fourth switch 540 in the disabled second branch 532. Otherwise there is no path for any leakage current to flow through the fourth switch 540 and S2 to charge the capacitor 542.

Referring to FIGS. 6 and 7A, at step 608, the controller 526 resets the monitoring circuit 528 by providing a high voltage ("1") control signal (R) to the discharge switch ($S_D$) to enable (close) the switch. Then, after a predetermined time, the controller provides a low voltage ("0") control signal (R) to the discharge switch ($S_D$) to disable (open) the switch.

At step 610, the controller 526 enables the monitoring circuit 528, with respect to the second branch 532. The controller 526 enables monitoring of the second branch 532 of the switch unit 524 by providing a low voltage ("0") control signal (M2) to the second measurement switch (S2), which in turn closes the switch. With the second measurement switch S2 closed, second branch leakage current ($I_{L2}$) from the open third switch 538 and fourth switch 540 will flow to the monitoring circuit 528, as depicted by dashed line 552.

At step 612, the controller 526 compares the voltage drop (Vc) across the storage element 542 to a second reference voltage (Vref_2) for the predetermined time (Δt). Vc will increase over time from the accumulation of the leakage current from the second branch ($I_{L2}$), according to Equation 1 (shown above). Where C represents the capacitance of the capacitor storage element 542, and $I_L$ represents the leakage current for one branch. In one or more embodiments, the controller 526 compares Vc to a second reference voltage (Vref_2), that is less than Vref, when the controller 526 evaluates the leakage current from a single branch. In another embodiment, the controller 526 compares Vc to Vref for the second predetermined time (Δt_2) at step 612.

If the controller 526 determines that Vc is greater than Vref_2 at step 612, the controller 526 proceeds to step 614 and generates an output signal indicative of an alert or fault associated with the second branch 532 of the switch unit 524. However, if Vc is not greater than Vref_2, the controller 526 proceeds to step 616 to determine if all branches of the switch unit have been tested. If not all the branches have been tested, the controller 526 proceed to step 618, disables the untested branch, and enables the previously tested branch.

Figure 7B:
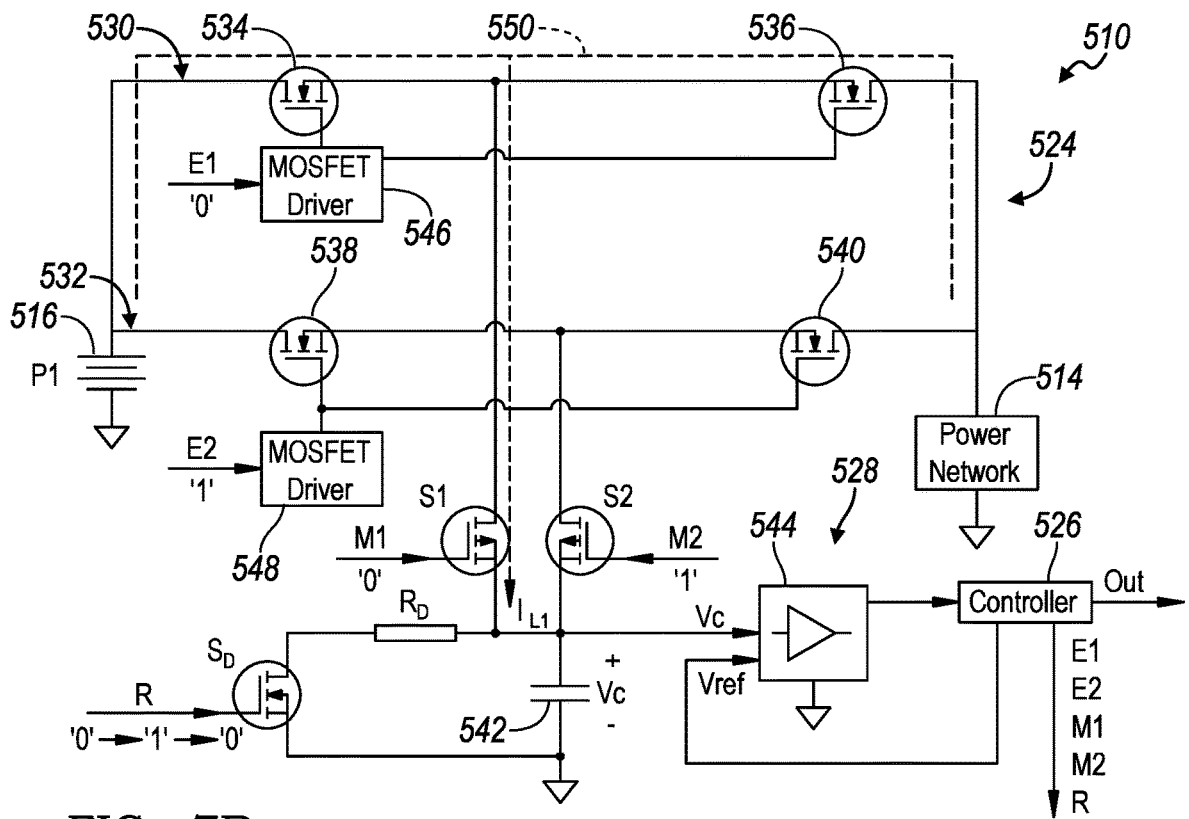
FIG. 7B is the circuit diagram of the power distribution system of FIG. 7A in a second configuration, further illustrating the method for monitoring leakage current of FIG. 6.

FIG. 7B is a circuit diagram of the power distribution system 510 implemented in a vehicle 512 having one battery, the main battery 516, and illustrated with the first branch 530 disabled, and the second branch 532 enabled. Again, the switches 534, 536, 538, 540 are active high nMOSFETs, according to the illustrated embodiment. The controller 526 disables the first branch 530 of the switch unit 524 by providing a low voltage ("0") control signal (E1) to the first driver 546, which in turn opens the first switch 534 and the second switch 536. The controller 526 enables the second branch 532 of the switch unit 524 by providing a high voltage ("1") control signal (E2) to the second driver 548, which in turn closes the third switch 538 and the fourth switch 540.

Referring to FIGS. 6 and 7B, at step 608, the controller 526 again resets the monitoring circuit 528 by providing a high voltage ("1") control signal (R) to the discharge switch ($S_D$) to enable (close) the switch. Then, after a predetermined time, the controller provides a low voltage ("0") control signal (R) to the discharge switch ($S_D$) to disable (open) the switch.

At step 610, the controller 526 enables the monitoring circuit 528, with respect to the first branch 530. The controller 526 enables monitoring of the first branch 530 of the switch unit 524 by providing a low voltage ("0") control signal (M1) to the first measurement switch (S1), which in turn closes the switch. With the first measurement switch S1 closed, first branch leakage current ($I_{L1}$) from the open first switch 534 and second switch 536 will flow to the monitoring circuit 528, as depicted by dashed line 550.

At step 612, the controller 526 again compares the voltage drop (Vc) across the storage element 542 to a second reference voltage (Vref_2) for the predetermined time (Δt), or alternatively compares Vc to Vref for the second predetermined time (Δt_2). Vc will increase over time from the accumulation of the leakage current from the first branch ($I_{L1}$), according to Equation 1 (shown above). Where C represents the capacitance of the capacitor storage element 542, and $I_L$ represents the leakage current for one branch.

If the controller 526 determines that Vc is greater than Vref_2 at step 612, the controller 526 proceeds to step 614 and generates an output signal indicative of an alert or fault associated with the first branch 530 of the switch unit 524. However, if Vc is not greater than Vref, the controller 526 proceeds to step 616 to again determine if all branches of the switch unit have been tested. Once all of the branches have been tested, the controller 526 proceeds to step 620 to complete the method.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A battery connection unit comprising:
   a first branch adapted to connect a first battery to at least one of a second battery and a vehicle load, the first branch comprising at least one first branch switch to enable/disable current flow along the first branch;

a second branch connected in parallel with the first branch, the second branch comprising at least one second branch switch to enable/disable current flow along the second branch;

a storage element;

a first measurement switch connected between the first branch and the storage element to enable/disable charging of the storage element;

a second measurement switch connected between the second branch and the storage element to enable/disable charging of the storage element; and a processor programmed to:
  disable at least one of the first branch and the second branch;
  enable at least one of the first measurement switch and the second measurement switch to charge the storage element with leakage current from the at least one disabled branch; and
  generate an output signal indicative of a switch fault in response to a storage element voltage associated with the leakage current exceeding a reference voltage within a predetermined time period.

2. The battery connection unit of claim 1, wherein the at least one first branch switch comprises a first switch and a second switch, and wherein the first measurement switch is connected between the first switch and the second switch.

3. The battery connection unit of claim 2, wherein the first switch and the second switch comprise Metal Oxide Semiconductor Field Effect Transistors (MOSFETs) arranged in a common-source back to back configuration.

4. The battery connection unit of claim 1, wherein the at least one second branch switch comprises a third switch and a fourth switch, and wherein the second measurement switch is connected between the third switch and the fourth switch.

5. The battery connection unit of claim 4, wherein the third switch and the fourth switch comprise Metal Oxide Semiconductor Field Effect Transistors (MOSFETs) arranged in a common-source back to back configuration.

6. The battery connection unit of claim 1, further comprising a discharge switch configured to discharge the storage element when the discharge switch is enabled, wherein the processor is further programmed to enable the discharge switch to discharge energy stored in the storage element prior to enabling at least one of the first measurement switch and the second measurement switch.

7. The battery connection unit of claim 1, wherein the first branch is adapted to connect the first battery to the second battery, wherein the processor is further programmed to:
  disable both the first branch and the second branch;
  enable both the first measurement switch and the second measurement switch to charge the storage element with leakage current from the disabled first branch and the disabled second branch; and
  generate the output signal indicative of the switch fault in response to the storage element voltage associated with the leakage current from the disabled first branch and the disabled second branch exceeding the reference voltage within the predetermined time period.

8. The battery connection unit of claim 7, wherein the processor is further programmed to:
  in response to generating the output signal indicative of the switch fault, disable the second measurement switch; and
  generate a first output signal indicative of a first branch switch fault in response to the storage element voltage exceeding a second reference voltage within the predetermined time period.

9. The battery connection unit of claim 8, wherein the processor is further programmed to:
  disable the first measurement switch;
  enable the second measurement switch to charge the storage element with leakage current from the disabled second branch; and
  generate a second output signal indicative of a second branch switch fault in response to the storage element voltage exceeding the second reference voltage within the predetermined time period, wherein the second reference voltage is equal to half of the reference voltage.

10. A battery connection unit comprising:
at least one branch adapted to connect a first battery to at least one of a second battery and a vehicle load, the at least one branch comprising:
  a first switch, and
  a second switch connected in series with the first switch along the at least one branch to enable/disable bidirectional current flow;
a storage element; and
a first measurement switch connected between the first switch and the second switch of the at least one branch and the storage element to enable/disable charging of the storage element with first branch leakage current.

11. The battery connection unit of claim 10, wherein the at least one branch comprises:
  a first branch comprising the first switch and the second switch;
  a second branch that is connected in parallel with the first branch, the second branch comprising a third switch and a fourth switch connected in series along the second branch to enable/disable bidirectional current flow; and
  the battery connection unit further comprising a second measurement switch connected between the third switch and the fourth switch of the second branch and the storage element to enable/disable charging of the storage element with second branch leakage current.

12. The battery connection unit of claim 11, further comprising:
a controller configured to:
  disable at least one of the first branch and the second branch;
  enable at least one of the first measurement switch and the second measurement switch to charge the storage element with leakage current from the at least one disabled branch; and
  generate an output signal indicative of a switch fault in response to a storage element voltage associated with the leakage current exceeding a reference voltage within a predetermined time period.

13. The battery connection unit of claim 12, wherein the controller is further configured to:
  generate the output signal indicative of the switch fault in response to a rate of change of the storage element voltage associated with the leakage current exceeding a predetermined rate of change value.

14. The battery connection unit of claim 11, further comprising:
a controller configured to:
  disable both the first branch and the second branch;
  disable the second measurement switch;

enable the first measurement switch to charge the storage element with leakage current from the disabled first branch; and generate a first output signal indicative of a first branch switch fault in response to a storage element voltage exceeding a second reference voltage within a predetermined time period.

15. The battery connection unit of claim 11, further comprising:

a controller configured to:
disable one of the first branch and the second branch;
enable the other of the first branch and the second branch;
enable one of the first measurement switch and the second measurement switch to charge the storage element with leakage current from the disabled branch; and
generate an output signal indicative of a switch fault in the disabled branch associated with the enabled measurement switch in response to a storage element voltage exceeding a second reference voltage within a predetermined time period.

16. The battery connection unit of claim 15, wherein the controller is further configured to:
disable the other of the first branch and the second branch;
enable the previously disabled first branch or second branch;
enable the other of the first measurement switch and the second measurement switch to charge the storage element with leakage current from the disabled branch; and
generate the output signal indicative of the switch fault in the disabled branch in response to the storage element voltage exceeding the second reference voltage within the predetermined time period.

17. A method of monitoring leakage current of a power distribution system comprising:

providing a battery connection unit with a first branch switch to enable/disable bidirectional current flow between a first battery and at least one of a second battery and a vehicle load, and a second branch switch to enable/disable bidirectional current flow between the first battery and the at least one the second battery and the vehicle load;

providing a monitoring circuit with a storage element, a first measurement switch connected between the first branch switch and the storage element to enable/disable charging of the storage element, and a second measurement switch connected between the second branch switch and the storage element to enable/disable charging of the storage element;

disabling at least one of the first branch switch and the second branch switch;

enabling at least one of the first measurement switch and the second measurement switch to charge the storage element with leakage current from the at least one disabled branch switch; and generating an output signal indicative of a switch fault in response to a storage element voltage associated with the leakage current exceeding a reference voltage within a predetermined time period.

18. The method of claim 17 further comprising:
disabling both the first branch switch and the second branch switch; and
enabling both the first measurement switch and the second measurement switch to charge the storage element with leakage current from the disabled first branch switch and the disabled second branch switch; and
generating the output signal indicative of the switch fault in response to the storage element voltage associated with the leakage current from the disabled first branch switch and the disabled second branch switch exceeding the reference voltage within the predetermined time period.

19. The method of claim 17 further comprising:
disabling one of the first branch switch and the second branch switch;
enabling the other of the first branch switch and the second branch switch;
enabling one of the first measurement switch and the second measurement switch to charge the storage element with leakage current from the disabled branch switch; and
generating the output signal indicative of the switch fault in the disabled branch in response to the storage element voltage exceeding the reference voltage within a second predetermined time period.

20. The method of claim 19 further comprising:
disabling the other of the first branch switch and the second branch switch;
enabling the previously disabled first branch switch or second branch switch;
enabling the other of the first measurement switch and the second measurement switch to charge the storage element with leakage current from the disabled branch switch; and
generating the output signal indicative of the switch fault in the disabled branch switch in response to the storage element voltage exceeding the reference voltage within the second predetermined time period.

* * * * *